310-369 SR

XR 3,495,103

X 89454

Feb. 10, 1970 YASUO NAKAJIMA ET AL 3,495,103

PIEZOELECTRIC CERAMIC RESONATOR

Filed April 24, 1968 2 Sheets-Sheet 1

INVENTORS
YASUO NAKAJIMA
MICHIO ISHIBASHI
TAKASHI NAGATA

BY Wenderoth, Lind & Ponack
ATTORNEYS

INVENTORS
YASUO NAKAJIMA
MICHIO ISHIBASHI
TAKASHI NAGATA

BY Wenderoth, Lind & Ponack
ATTORNEYS

United States Patent Office 3,495,103
Patented Feb. 10, 1970

3,495,103

PIEZOELECTRIC CERAMIC RESONATOR

Yasuo Nakajima, Osaka-shi, Michio Ishibashi, Suita-shi, and Takashi Nagata, Ikeda-shi, Japan, assignors to Matsushita Electric Industrial Co., Ltd., Osaka, Japan Filed Apr. 24, 1968, Ser. No. 723,744
Int. Cl. H01v 7/00
U.S. Cl. 310—9.1 5 Claims

ABSTRACT OF THE DISCLOSURE

A piezoelectric ceramic resonator. A rubber body having a slit therein has a polarized piezoelectric ceramic disc having electrodes on opposite sides thereof and which vibrates in the thickness-shear mode and is positioned in said slit so as to have imparted thereto the elastic force of said rubber body. A pair of lead wires extend through said rubber body and are in electrically conductive contact with the respective electrodes of said ceramic disc, being held in contact therewith by the elastic force of said rubber body. One end of each of said pair of lead wires acts as an electrical terminal and the other end of each of said pair of lead wires is secured to said rubber body.

BACKGROUND OF THE INVENTION

Field of the invention

This invention relates to a piezoelectric ceramic resonator which vibrates in the thickness-shear mode. In particular, it relates to a piezoelectric ceramic resonator which is free from unwanted responses at subresonant vibrations and which is especially useful for an electrical wave filter and a discriminator in a high frequency region.

Description of the prior art

A piezoeletcric ceramic resonator which vibrates in the thickness-shear mode has a resonant frequency of the thickness-shear vibration at a certain frequency. The resonant frequency of the thickness-shear vibration is inversely proportional to the thickness of the ceramic resonator. Such a ceramic resonator is basically applicable to a high frequency region. As a practical matter, the ceramic resonator has lots of unwanted responses at subresonant vibrations. The subresonant vibrations are considered to be produced by a boundary condition at the finite contour dimensions of the ceramic resonator and/or the porosities of the ceramic body.

Some of the subresonant vibrations are eliminated by loading of a material which will cause an acoustical loss which can be attached to an edge of the resonator, as described in the British Patent No. 914,058. Electrodes applied to a limited area of both surfaces of a ceramic body are also useful for eliminating some of the unwanted responses. An AT cut quartz resonator having a convex form or a bevelled form is practically free of the unwanted responses. Another method to eliminate the unwanted responses is to hold the periphery of the resonator with a tensioned strap having a lining of a synthetic plastic damping material as described in British Patent No. 833,930.

The resonators according to the prior art must be combined with electrical lead wires without impairing the frequency response of the resonators. In addition, the resonators are required to be encapsulated within a suitable material for improving the durability with respect to the surrounding atmosphere. The electrodes applied to a limited area are apt to impair the transducer effect for converting electrical energy to mechanical energy or vice versa. Therefore, it has been difficult to miniaturize the resonators.

SUMMARY OF THE INVENTION

It is, therefore, an object of the present invention to overcome these disadvantages and to provide a thickness-shear mode type piezoelectric ceramic resonator which vibrates predominantly in the thickness-shear mode and which is free from unwanted responses at subresonant vibrations.

Another object of the present invention is to provide a piezoelectric ceramic resonator having a ceramic disc and electrical lead wires held by a rubber body so that subresonances are eliminated.

These objects are achieved by providing a piezoelectric ceramic resonator according to the present invention which comprises a rubber body having a slit therein. A polarized piezoelectric ceramic disc having electrodes on opposite faces thereof and vibrating in the thickness-shear mode is positioned in the slit of the rubber body. A pair of electrical lead wires extend into the rubber body through the slit and are held in conductive contact with the respective electrodes of the ceramic disc by the elastic force of the rubber body. One end of each of the pair of lead wires acts as an electrical terminal and the other end of each of the pair of lead wires is secured to the rubber body.

BRIEF DESCRIPTION OF THE DRAWINGS

Other objects and advantages will become apparent from the following description taken in connection with the drawings, wherein.

DESCRIPTION OF THE PREFERRED EMBODIMENT

Figure 1A:
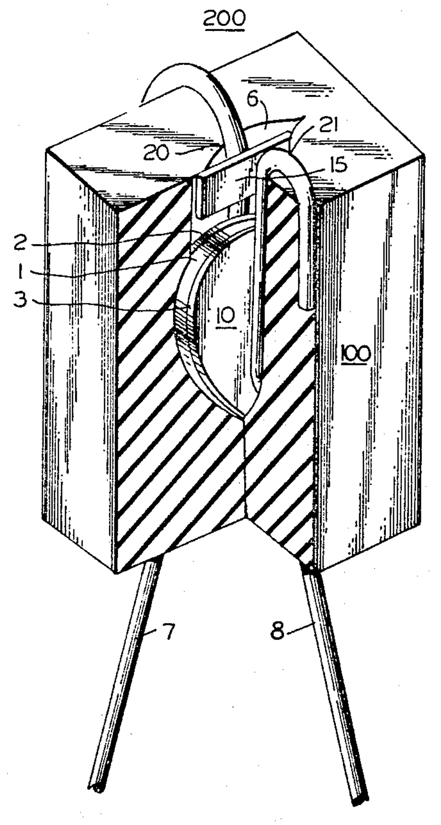
FIG. 1*a* is a perspective view, partly in section, showing a piezoelectric ceramic resonator according to the present invention.
Figure 1B:
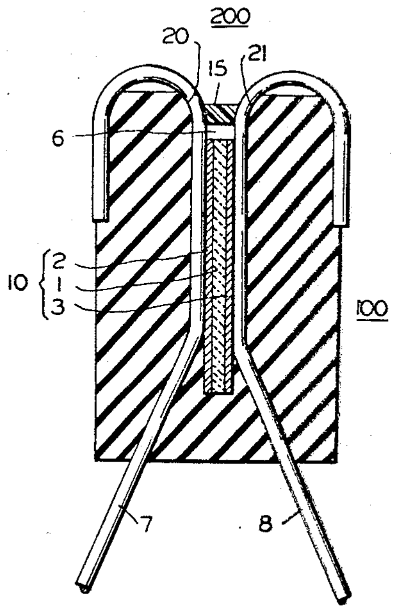
FIG. 1*b* is a sectional view of the piezoelectric ceramic resonator as shown in FIG. 1*a*.

Referring to FIGS. 1*a* and 1*b*, reference character 200 designates, as a whole, the piezoelectric ceramic resonator of the present invention. A polarized piezoelectric ceramic disc 10 having a pair of lead wires 7 and 8 on opposite sides thereof is sandwiched into a slit 6 of a rubber body 100 so as to have imparted thereto the elastic force of said rubber body 100. Each of said lead wires 7 and 8 extends through the rubber body 100 along the respective faces of the ceramic disc 10. One end of each of the pair of lead wires 7 and 8 acts as an electrical terminal and the o'her end of each of the pair of lead wires 7 and 8 is secured to the rubber body 100 in any available and suitable method. A preferred method for securing the lead wires 7 and 8 is to turn the ends of the wires over the edges 20 and 21 of the slit 6 so as to pinch the rubber body 100 as shown in FIGS. 1*a* and 1*b*.

The ceramic disc 10 comprises a polarized piezoelectric ceramic wafer 1 having electrodes 2 and 3 attached thereto. Each of the electrodes 2 and 3 is held in conductive contact with the respective wires of the pair of lead wires 7 and 8, respectively, by the elastic force of said rubber body 100. An electrical insulator 15 is positioned between the pair of lead wires at the open mouth of the slit 6 as shown in FIGS. 1*a* and 1*b*. Said insulator 15 can be omitted when the distance between the pair of lead wires 7 and 8 at the open mouth of the slit 6 is great enough to electrically insulate the wires from each other. One end of each of the pair of lead wires 7 and 8 is an electrical terminal for supplying an electrical signal to the respective electrodes 2 and 3.

The operation of the piezoelectric ceramic resonator will be described in detail in connection with FIG. 2 and FIG. 3.

Figure 2:
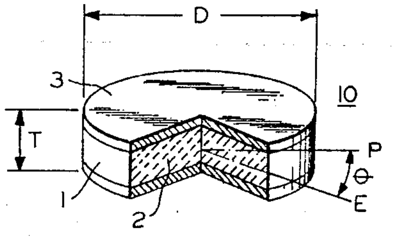
FIG. 2 is a perspective view, partly in section, showing a polarized ceramic disc having electrodes thereon which forms a part of the ceramic resonator of FIG. 1.

Referring to FIG. 2 wherein similar characters designate components similar to those of FIG. 1, the arrow P shows the direction of polarization of the ceramic disc and is at angle $\theta$ from the Z axis which is perpendicular to the axis of the ceramic wafer 1. The ceramic wafer 1 can be made of any piezoelectric ceramic material such as solid solutions of lead titanate and lead zirconate in certain mole ratios and modifications thereof and combined with certain additives. The electrodes can be formed by using conductive material such as silver or nickel in a conventional manner, for example, electroless plating. The use of a copper electroless plating method makes it possible to form uniform and thin electrodes less than 1 micron thick.

Referring once again to FIG. 2, characters D and T represent, respectively, the diameter and the thickness of the ceramic wafer with the electrodes thereon. The ceramic resonator of the present invention is characterized in that the resonance frequency, *fo*, is inversely proportional to the thickness T. The relationship is represented by the equation:

$$fo \times T = K \quad (1)$$

where K is a frequency constant of the piezoelectric ceramic material. The desired resonance frequency for application in a circuit is therefore established by establishing the thickness T according to Formula 1.

On the other hand, the diameter D is substantially independent of the resonance frequency, *fo*, but has a strong effect on the responses at the subresonances. When the diameter D is changed by a method such as a peripheral lapping, the frequency responses at the subresonances is greatly changed. The reason is that there is an irregular reflection of the elastic wave of the thickness-shear vibration due to the presence of the finite boundary at the periphery of the wafer. The degree of the irregular reflection is closely related to the ratio $D/T$. It has been discovered in connection with the present invention that a suitable range for this ratio is represented by the equation:

$$4 < D/T < 20 \quad (2)$$

A value of $D/T$ greater than 20 produces an unwanted subresonance which is too strong to be eliminated by the construction of the resonator according to the present invention. A value of $D/T$ less than 4 results in such a weak response of the thickness-shear vibration that the resonator is not useful for a practical application.

The polarization angle $\theta$ has an effect on the frequency band width between the resonance frequency and the antiresonance frequency of the ceramic resonator. The frequency bandwidth decreases continuously with an increase in the angle $\theta$. Therefore, the frequency bandwidth of the ceramic resonator can be adjusted to a desired value for use in a circuit application by controlling the angle $\theta$. It has ben discovered according to the present invention that a suitable range of the angle $\theta$ is from zero to sixty degrees. When the angle $\theta$ exceeds sixty degrees, the exciting level of the thickness-shear vibration becomes so low that the frequency responses of the ceramic resonator are not available.

Figure 3:
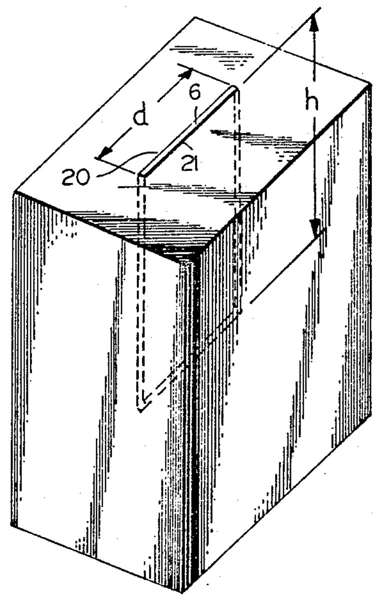
FIG. 3 is a perspective view showing a rubber body having a slit therein which forms a part of the ceramic resonator of FIG. 1.

Referring to FIG. 3, reference character 100 designates, as a whole, the rubber body. In FIG. 3, similar characters designate components similar to those of FIG. 1.

According to the present invention, the rubber body 100 has many functions: (1) it acts as a vibration damper for eliminating unwanted responses of the ceramic resonator; (2) it acts as means for holding the electrical lead wires in electrically conductive relationship with the electrodes of the ceramic disc; (3) it serves as encapsulation means and mounting means for mounting of the ceramic disc; and (4) it serves as electrical insulation between the lead wires. Such functions can be achieved by making a rubber body 100 from a natural rubber and/or a synthetic rubber such as butyl rubber, a silicone rubber or a chiochol rubber.

The rubber material is in direct contact with the lead wires and the electrodes of the ceramic disc, as described hereinbefore. Therefore, it is preferable that the rubber material contain as little chemically active sulfur as possible, because the sulfur corrodes the conductive metals.

Another important characteristic of the rubber material according to the present invention is its hardness. A suitable hardness of the rubber material is from ten to sixty on the Shore A Scale. A soft rubber material having a hardness less than ten on the Shore A Scale absorbs vibrations so greatly that the ceramic resonator of the present invention is not practically useful. A hard rubber material having a hardness above sixty on the Shore A Scale does not have satisfactory elastic action and does not eliminate or suppress the unwanted vibrations.

Referring once again to FIG. 3, the characters $d$ and $h$ are the width and depth of the slit 6, respectively. The width $d$ and the depth $h$ must be in the following relation with respect to the diameter D of the ceramic disc:

$$d < D < h \quad (3)$$

The relation $d<D$ is required in order to eliminate the response of subresonances and the relation $D<h$ is required in order to provide a stable mounting of the ceramic disc and the lead wires, in accordance with the present invention. The condition $d<D$ is necessary to apply the strongest elastic force to the periphery of the ceramic disc. When made according to these conditions, the rubber body satisfactorily eliminates the subresonances which cause maximum vibration displacements at the periphery of the ceramic disc.

The condition $D<h$ is important for embedding the entire diameter of the ceramic disc and the lead wires attached to the electrodes in the rubber body so as to mount the vibrating ceramic disc in a stable fashion.

Figure 4:
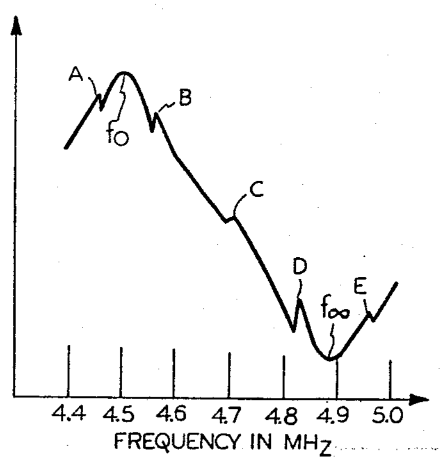
FIG. 4 is an admittance curve of a ceramic disc as shown in FIG. 2 at various frequencies.

FIG. 4 shows the frequency response of a polarized ceramic disc having electrodes thereon as shown in FIG. 2. The ceramic material of the disc had a composition of 99 percent by weight $$Pb(Mg_{1/3},Nb_{2/3})\cdot_{0.4375}Ti_{0.4375}Zr_{0.125}O_3$$

plus one percent by weight $MnO_2$ and the angle of polarization was zero degrees. The ceramic disc had a diameter D of 2.5 mm. and a thickness T of 0.27 mm. The electrodes were made of silver formed by a conventional silver immersing plating method.

Referring again to FIG. 4, the frequency *fo*, having a maximum admittance, and the frequency $f\infty$, having a minimum admittance, are the resonance frequency and the anti-resonance frequency of the thickness-shear mode, respectively. Pips A, B, C, D and E are responses at the subresonances. When such a disc is used for a ceramic resonator, for instance, such as an electrical wave filter and discriminator, the subresonances at the pips are responsible for distortion of the electrical signal.

Figure 5:
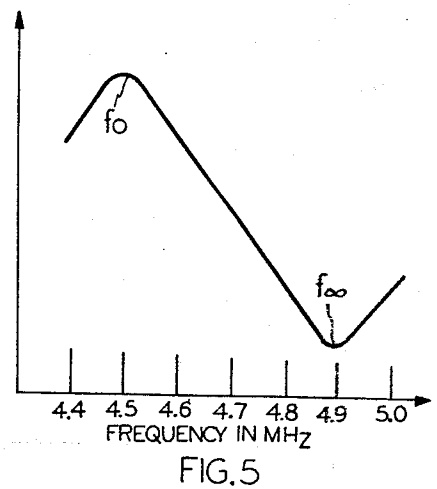
FIG. 5 is an admittance curve of a ceramic resonator of the present invention at various frequencies.

FIG. 5 shows the frequency response of a piezoelectric ceramic resonator comprising a ceramic disc combined with a rubber body in accordance with the invention. The ceramic disc is the same as that having the frequency response of FIG. 4 when not combined with a rubber body. The ceramic disc and lead wires were sandwiched in the slit of a butyl rubber body, as shown in FIG. 1, and having a hardness of 17 degrees on the Shore A Scale. The width $d$ and the depth $h$ of the slit were 2.0 mm. and 3.5 mm. respectively. It is clear from FIG. 5 that the frequency response curve shows pure tuned responses at the resonance frequency and the anti-resonance frequency.

The pips A, B, C, D and E shown in FIG. 4 have been successfully eliminated.

From the description and drawings of the embodiments chosen as exemplary of the preferred application of the principles of both the method and apparatus aspects of the present invention, it will be clear to those skilled in the art that certain minor modifications and variations may be employed without departing from the essence and true spirit of the invention. Accordingly, it is to be understood that the invention should be deemed limited only by the fair scope of the claims that follow and equivalents thereto.

What is claimed is:

1. A piezoelectric ceramic resonator comprising a rubber body having a slit therein, a polarized piezoelectric ceramic disc having electrodes on opposite faces thereof and which vibrates in the thickness-shear vibration mode positioned in said slit and having imparted thereto the elastic force of said rubber body, and a pair of lead wires which extend through said rubber body and being held in electrically conductive contact with the respective electrodes of said ceramic disc by the elastic force of said rubber body, one end of each of said pair of lead wires acting as an electrical terminal and the other end of each of said pair of lead wires being secured to said rubber body.

2. A piezoelectric ceramic resonator as claimed in claim 1, wherein said other end of each of said pair of lead wires is turned over and pinches said rubber body.

3. A piezoelectric ceramic resonator as claimed in claim 1, wherein said rubber body has a hardness of from 10 to 60 on the Shore A Scale.

4. A piezoelectric ceramic resonator as claimed in claim 1, wherein said slit has a width shorter than the diameter of said ceramic disc and a depth greater than said diameter.

5. A piezoelectric ceramic resonator as claimed in claim 1, wherein said ceramic disc has a diameter to thickness ratio of from 4:1 to 20:1 and a polarization angle of from 0 to 60 degrees.

References Cited

UNITED STATES PATENTS

| | | | |
|---|---|---|---|
| 2,842,687 | 7/1958 | Van Dyke | 310—9.1 |
| 3,113,223 | 12/1963 | Smith | 310—9.1 |
| 3,423,700 | 1/1969 | Curran | 310—9.1 |

J D MILLER, Primary Examiner

U.S. Cl. X.R.

310—9.2, 9.7